United States Patent
Li et al.

(10) Patent No.: US 9,613,998 B2
(45) Date of Patent: Apr. 4, 2017

(54) BACKSIDE ILLUMINATION IMAGE SENSOR AND METHOD FOR REDUCING DARK CURRENT OF BACKSIDE ILLUMINATION IMAGE SENSOR

(71) Applicant: GALAXYCORE SHANGHAI LIMITED CORPORATION, Shanghai (CN)

(72) Inventors: Wenqiang Li, Shanghai (CN); Lixin Zhao, Shanghai (CN); Jie Li, Shanghai (CN); Ze Xu, Shanghai (CN)

(73) Assignee: Galaxycore Shanghai Limited Corporation, Shanghai (CN)

( * ) Notice: Subject to any disclaimer, the term of this patent is extended or adjusted under 35 U.S.C. 154(b) by 0 days.

(21) Appl. No.: 14/913,968

(22) PCT Filed: Jun. 24, 2014

(86) PCT No.: PCT/CN2014/080569
§ 371 (c)(1),
(2) Date: Feb. 23, 2016

(87) PCT Pub. No.: WO2015/027742
PCT Pub. Date: Mar. 5, 2015

(65) Prior Publication Data
US 2016/0225804 A1    Aug. 4, 2016

(30) Foreign Application Priority Data
Aug. 30, 2013 (CN) .......................... 2013 1 0391338

(51) Int. Cl.
*H01L 31/062* (2012.01)
*H01L 27/146* (2006.01)

(52) U.S. Cl.
CPC ...... *H01L 27/1464* (2013.01); *H01L 27/1463* (2013.01); *H01L 27/14612* (2013.01); *H01L 27/14616* (2013.01)

(58) Field of Classification Search
CPC ........... H01L 27/1464; H01L 27/14612; H01L 27/1463; H01L 27/14616
(Continued)

(56) References Cited

U.S. PATENT DOCUMENTS 7,005,315 B2   2/2006 Hong et al.
7,538,307 B1   5/2009 Lauxtermann
(Continued)

FOREIGN PATENT DOCUMENTS

CN         1716628 A     1/2006
CN       101335282 A    12/2008
(Continued)

OTHER PUBLICATIONS

PCT International Search Report, PCT/CN2014/080569, Sep. 29, 2014, 6 Pages.

*Primary Examiner* — Anthony Ho
(74) *Attorney, Agent, or Firm* — Fenwick & West LLP

(57) ABSTRACT

A backside illumination image sensor and a method for reducing a dark current of the backside illumination image sensor. The backside illumination image sensor comprises: a photodiode, a first conductive type isolated layer (120); a gate structure of a pass transistor, corresponding to the first conductive type isolated layer (120) and formed on an upper surface of a first conductive type semiconductor substrate (100), the gate structure (130) comprising: gate oxide (131), a gate layer (132), and a gate sidewall (133), and the gate structure (130) correspondingly covering the photodiode; and a floating diffusion zone (140), formed in the first conductive type semiconductor substrate (100) and having (Continued)

second conductive type heavy doping. In the backside illumination image sensor, a defect does not easily appear on a surface, right above the photodiode, of the first conductive type semiconductor substrate (100), so that a dark current is effectively prevented from being produced.

9 Claims, 1 Drawing Sheet

(58) Field of Classification Search
USPC ........................................................ 257/292
See application file for complete search history.

(56) References Cited

U.S. PATENT DOCUMENTS

| | | | |
|---|---|---|---|
| 7,847,326 | B2 | 12/2010 | Park et al. |
| 8,163,591 | B2 | 4/2012 | Park et al. |
| 8,378,402 | B2 | 2/2013 | Moon et al. |
| 8,736,727 | B2 | 5/2014 | Ando |
| 2006/0006488 | A1 | 1/2006 | Kanbe |
| 2008/0302949 | A1 | 12/2008 | Kim et al. |
| 2009/0001494 | A1 | 1/2009 | Park et al. |
| 2011/0108709 | A1 | 5/2011 | Park et al. |
| 2011/0169055 | A1 | 7/2011 | Wu et al. |
| 2011/0242376 | A1 | 10/2011 | Ando |
| 2012/0085888 | A1 | 4/2012 | Endo et al. |
| 2013/0009224 | A1 | 1/2013 | Ohri |
| 2013/0134542 | A1 | 5/2013 | Lu et al. |

FOREIGN PATENT DOCUMENTS

| | | |
|---|---|---|
| CN | 102130052 A | 7/2011 |
| CN | 102214667 A | 10/2011 |
| CN | 102867834 A | 1/2013 |
| CN | 103137633 A | 6/2013 |
| CN | 103413818 A | 11/2013 |
| CN | 103441133 A | 12/2013 |

BACKSIDE ILLUMINATION IMAGE SENSOR AND METHOD FOR REDUCING DARK CURRENT OF BACKSIDE ILLUMINATION IMAGE SENSOR

This application claims priority to Chinese Patent Application No. 201310391338.X, entitled "Backside Illumination Image Sensor and Method for Reducing Dark Current of Backside Illumination Image Sensor, filed on Aug. 30, 2013, the entire disclosure of which is incorporated herein by reference.

TECHNICAL FIELD

The present disclosure generally relates to semiconductor technology, and more particularly, to a back side illumination image sensor and a method for reducing dark current of a back side illumination image sensor.

BACKGROUND

An image sensor is a semiconductor device for converting an optical signal to an electrical signal. The image sensor includes a photodiode (PD) for detecting lights and a logic circuit for converting the detected lights to electrical signals.

A conventional image sensor usually has a front side illumination structure, wherein a photodiode is formed below a surface of a substrate, and a logic circuit is formed above the photodiode. Before reaching the photodiode, lights have to pass through the logic circuit and multilayer structures, which results in light loss, or light crosstalk to adjacent image sensor unit chip. Therefore, light response characteristics of each image sensor unit's photodiode are impacted.

In order to solve the above problems, Back Side Illumination (BSI) image sensors have been developed. In the BSI image sensor, lights do not pass through the logic circuit, but directly reach the photodiodes from the back side of the substrate. Thus, the light response characteristics of the photodiode are improved.

However, there is a large dark current in the BSI image sensor. In an operating process of the image sensor, the dark current may be mixed with the signal currents, resulting in interference to the signal and degradation of image sensor performance. More information about the dark current problem of image sensor may refer to a Chinese patent application with a publication No. 103137633A.

Therefore, in order to solve the problem of the large dark current in the conventional BSI image sensor, a new BSI image sensor and a method for reducing dark current of the same are needed.

SUMMARY

The present disclosure aims to solve the problem of the large dark current in the conventional BSI image sensor, and provide a BSI image sensor and a method for reducing dark current of the same.

In order to solve the above problems, a BSI image sensor is provided in embodiments of the present disclosure. The BSI image sensor may include:

a photodiode formed by forming an area with a second type conductivity in a semiconductor substrate with a first type conductivity, wherein the area with the second type conductivity is defined as an area for collecting photo-generated carriers;

an isolation layer with the first type conductivity formed in the semiconductor substrate with the first type conductivity and above the photodiode;

a gate structure of a pass transistor formed on a top surface of the semiconductor substrate with the first type conductivity and being corresponding to the isolation layer with the first type conductivity, wherein the gate structure includes a gate oxide layer, a gate electrode layer and a gate spacer, and the gate structure covers the photodiode correspondingly; and a floating diffusion area formed in the semiconductor substrate with the first type conductivity and being heavily doped with the second type conductivity.

In some embodiments, the BSI image sensor may further include: an isolation ring with the first type conductivity, wherein the isolation ring with the first type conductivity is formed in the semiconductor substrate with the first type conductivity, surrounds the photodiode, and is adapted for preventing carrier crosstalk between adjacent photodiodes.

In some embodiments, the area with the second type conductivity and the isolation layer with the first type conductivity have self alignment features.

In some embodiments, a photoresist layer is coated on the surface of the semiconductor substrate with the first type conductivity; by using a first mask, a photolithography process comprising exposure and development is performed; and a doping process is performed to form the photodiode and the isolation layer with the first type conductivity.

In some embodiments, a photoresist layer is coated on the surface of the semiconductor substrate with the first type conductivity; by using a first mask, a photolithography process comprising exposure and development is performed, so as to form a groove on the surface of the semiconductor substrate with the first type conductivity; a doping process is performed to form the photodiode in a portion of the semiconductor substrate with the first type conductivity corresponding to a bottom of the groove; sidewalls of the groove is etched to enlarge the groove; and the groove is filled to form an isolation layer with the first type conductivity in a portion of the semiconductor substrate with the first type conductivity corresponding to the groove.

In some embodiments, the BSI image sensor may further include: a light doped area with the second type conductivity formed in the semiconductor substrate with the first type conductivity; and a light doped area with the first type conductivity formed below the light doped area with the second type conductivity, wherein the light doped area with the second type conductivity and the light doped area with the first type conductivity have self alignment features; and wherein at least a portion of the light doped area with the second type conductivity and a portion of the light doped area with the first type conductivity are disposed below the gate structure of the pass transistor, and are in contact with the floating diffusion area.

In some embodiments, a photoresist layer is coated on the surface of the semiconductor substrate with the first type conductivity; by using a second mask, a photolithography process comprising exposure and development is performed; and a doping process is performed to form the light doped area with the second type conductivity and the light doped area with the first type conductivity.

In some embodiments, a photoresist layer is coated on the surface of the semiconductor substrate with the first type conductivity; by using a second mask, a photolithography process comprising exposure and development is performed, so as to form a groove on the surface of the semiconductor substrate with the first type conductivity; a doping process is performed to form the light doped area with the second type conductivity in a portion of the semiconductor substrate with the first type conductivity corresponding to a bottom of the groove; sidewalls of the groove is etched to enlarge the groove; and the groove is filled to form the light doped area with the first type conductivity.

In some embodiments, a thermal oxidation process and a patterning process are employed to from the gate oxide layer, the gate electrode layer covering the gate oxide layer, and the gate spacer on two sides of the gate oxide layer successively.

In some embodiments, when the first type conductivity is P-type, the second type conductivity is N-type; or when the first type conductivity is N-type, the second type conductivity is P-type.

In some embodiments, the carriers are electrons or holes.

In order to solve the above problems, a method for reducing dark current of the above BSI image sensor is also provided in embodiments of the present disclosure. The method may include: when the semiconductor substrate with the first type conductivity is a P-type semiconductor substrate, applying a voltage ranging from −3.0V to −0.5V to the gate structure, wherein the voltage makes holes accumulate at a portion of the P-type semiconductor substrate corresponding to the gate structure, such that the defects at the interface between the P-type semiconductor substrate and the gate oxide layer are isolated from the N-type area of the photodiode to reduce the dark current; and when the semiconductor substrate with the first type conductivity is a N-type semiconductor substrate, applying a voltage ranging from +0.5V to +3.0V to the gate structure, wherein the voltage makes electrons accumulate at a portion of the N-type semiconductor substrate corresponding to the gate structure, such that the defects at the interface between the N-type semiconductor substrate and the gate oxide layer are isolated from the P-type area of the photodiode to reduce the dark current.

Compared with the conventional technology, the embodiments of the present disclosure have following advantages:

in embodiments of the present disclosure, the gate of the pass transistor is extended to a portion of the surface of the semiconductor substrate with the first type conductivity right above the photodiode, such that the portion of the surface right above the photodiode may not be etched, and defects may not be easily formed at the portion of the surface right above the photodiode, and then the dark current is prevented.

further, the isolation ring with the first type conductivity is formed to isolation different photodiodes, such that signal crosstalk is prevented.

DETAILED DESCRIPTION

A BSI image sensor usually includes a photodiode adapted for receiving lights to generate photo-charges, and a pass transistor adapted for transferring the photo-charges to a Floating Diffusion (FD) area. In the BSI image sensor, a plurality of etching processes may be performed to form a gate electrode and a corresponding gate spacer of the pass transistor. The etching processes may etch a portion of the substrate surface above the photodiode, and cause a lot of defects at the portion of the substrate surface. The defects may generate deep energy levels in material of the surface of the semiconductor substrate, and then the deep energy levels may cause the semiconductor substrate to generate carriers under lightless condition. These carriers may be easily transmitted to the photodiode under the defects, and generate a dark current.

Therefore, a Back Side Illumination (BSI) image sensor is provided in embodiments of the present disclosure. In the BSI image sensor, a gate of a pass transistor extends to a portion of a surface of a substrate right above a photodiode, such that, in subsequent processes, defects, formed by etching, at the portion of the substrate surface right above the photodiode may be prevent, and the dark current is also prevented.

In order to clarify the objects, characteristics and advantages of the disclosure, the embodiments of the present disclosure will be described in detail in conjunction with the accompanying drawings.

Figure 1:
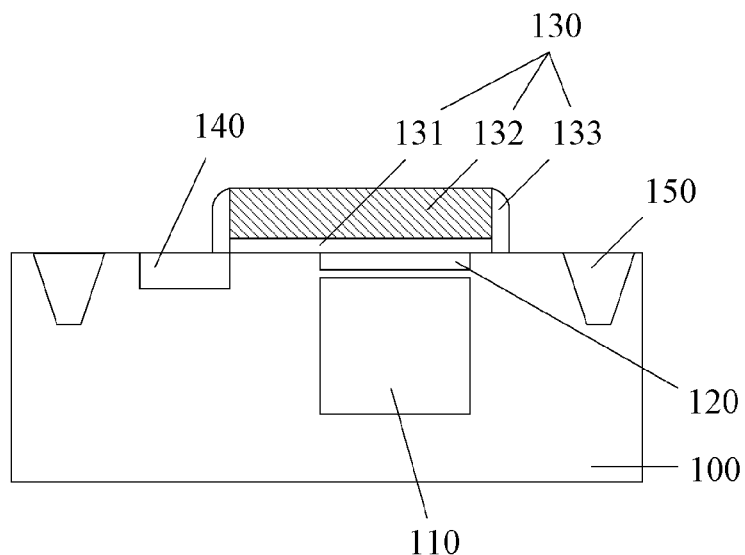
FIG. 1 schematically illustrates a structural diagram of a BSI image sensor according to one embodiment of the present disclosure.

As shown in FIG. 1, a BSI image sensor is provided in one embodiment of the present disclosure. The BSI image sensor includes a semiconductor substrate with a first type conductivity 100, a photodiode (not labeled), an isolation layer with the first type conductivity 120, a floating diffusion area 140 and a gate structure 130 of a pass transistor. The gate structure 130 of the pass transistor is disposed on the semiconductor substrate with the first type conductivity 100, and the isolation layer with the first type conductivity 120 and the floating diffusion area 140 are disposed in a portion of the semiconductor substrate with the first type conductivity 100 below the gate structure 130. The photodiode is disposed in a portion of the semiconductor substrate with the first type conductivity 100 below the isolation layer with the first type conductivity 120, and the photodiode consists of the semiconductor substrate with the first type conductivity 100 and an area with a second type conductivity 110.

In one embodiment, the BSI image sensor may be a Charge Coupled Device (CCD) image sensor or a Complementary Metal-Oxide-Semiconductor (CMOS) image sensor. Besides the components shown in FIG. 1, the BSI image sensor of this embodiment may further include a reset transistor, a source follower transistor, or other components. Namely, the BSI image sensor may have a 3 T (3 transistors), 4 T or 5 T structure.

In one embodiment, the semiconductor substrate with the first type conductivity 100 may be a silicon substrate, a semiconductor substrate having an epi-layer, or a Silicon-On-Insulator (SOI) substrate. In another embodiment, the semiconductor substrate with the first type conductivity 100 may include a material selected from a group consisting silicon carbide, gallium arsenide, indium arsenide, indium phosphide, silicon germanium, silicon germanium carbide, gallium arsenide phosphide, indium gallium phosphorus, or combinations thereof.

In one embodiment, the photodiode may be formed by forming the area with the second type conductivity 110 in the semiconductor substrate with the first type conductivity 100. The area with the second type conductivity 110 may be defined as a collection region for photo-generated carriers of the photodiode. The carriers may be electrons or holes. In this embodiment, electrons are taking as an example of the carriers.

In other embodiments of the present disclosure, a pinned layer or other structures may be formed below each photodiode.

In one embodiment, the carriers are electrons. Thus, the first type conductivity is P-type, and the second type conductivity is N-type. Therefore, the semiconductor substrate with the first type conductivity 100 may be doped with a P-type dopant, for example, boron. In other embodiments of the present disclosure, the carriers may be holes. The first type conductivity is N-type, and the second type conductivity is P-type correspondingly.

In one embodiment, the isolation layer with the first type conductivity 120 is formed in the semiconductor substrate with the first type conductivity 100 and above the photodiode (namely, the area with the second type conductivity 110). The isolation layer with the first type conductivity 120 may be formed by an ion implantation process implanting impurity ions through a surface of the semiconductor substrate with the first type conductivity 100. A doping concentration of the isolation layer with the first type conductivity 120 is 10 to 100 times larger than that of the semiconductor substrate with the first type conductivity 100. The isolation layer with the first type conductivity 120 can prevent a current caused by surface defects of the semiconductor substrate with the first type conductivity 100 to some extent, such that an output of the photodiode is more accurate, and an image generated based on the output has no distortion. However, if the semiconductor substrate with the first type conductivity 100 has too much surface defects, there may still be a large dark current in the image sensor. Therefore, other technical solutions are employed to prevent the dark current in following embodiments of the present disclosure.

In one embodiment, the floating diffusion area 140 is heavily doped with dopant having a second type conductivity. The floating diffusion area 140 may be defined as an input node for receiving the photo-generated carriers from the photodiode, and then the photo-generated carriers are transmitted to other transistors for signal amplification and reading, so as to form a corresponding image signal.

In one embodiment, the gate structure 130 of the pass transistor includes a gate oxide layer 131, a gate electrode layer 132 and a gate spacer 133. The gate oxide layer 131 is formed on the surface of the semiconductor substrate with the first type conductivity 100, the gate electrode layer 132 is formed on a surface of the gate oxide layer 131, and the gate spacer 133 is formed on sidewalls of the gate oxide layer 131 and the gate electrode layer 133. The gate oxide layer 131 may include silicon oxide, high K dielectric material, silicon nitride or low K dielectric material. In one embodiment, the gate oxide layer 131 is silicon oxide. The gate electrode layer 132 may include (doped) polysilicon or metal material. In one embodiment, the gate electrode layer 132 is (doped) polysilicon. The spacer 133 may include silicon oxide, silicon nitride, or silicon oxynitride. In one embodiment, the spacer 133 is silicon nitride.

In one embodiment, the gate structure 130 of the pass transistor is disposed above the photodiode correspondingly. As the isolation layer with the first type conductivity 120 is formed in the portion of the semiconductor substrate with the first type conductivity 100 above the photodiode, the gate structure 130 is formed on the surface of the semiconductor substrate with the first type conductivity 100 corresponding to the isolation layer with the first type conductivity 120. As the gate structure 130 of the pass transistor is disposed above the isolation layer with the first type conductivity 120, etching processes for forming the gate structure 130 (including an etching process for forming the gate oxide layer 131 and the gate electrode layer 122, and an etching process for forming the gate spacer 133) would not etch the portion of the semiconductor substrate with the first type conductivity 100 above the photodiode. That is, the portion of the surface of the semiconductor substrate with the first type conductivity 100, where the isolation layer with the first type conductivity 120 locates, would not be etched. Hence, the gate structure 130 can reduce defects at an interface between the gate oxide layer 131 and the portion of the semiconductor substrate with the first type conductivity 100 corresponding to the gate structure 130. Therefore, there are no defects at the portion of the semiconductor substrate with the first type conductivity 100, a dark current of the image sensor caused by defects of the portion of the surface can be prevented, and performance of the image sensor can be improved.

In one embodiment, lights illuminate a back surface of the image sensor, then penetrate the semiconductor substrate with the first type conductivity 100, and then are absorbed by the photodiode to generate photo-generated carriers. However, some lights may still penetrate the photodiode and reach the gate structure 130, the gate structure 130 absorbs a part of the lights, and the rest part of the lights penetrates the gate structure and reaches a surface thereof.

In one embodiment, the BSI image sensor further includes an isolation ring with the first type conductivity 150. The isolation ring with the first type conductivity 150 is formed in the semiconductor substrate with the first type conductivity 100, and surrounds the photodiode. The isolation ring with the first type conductivity 150 is adapted for preventing crosstalk between adjacent photodiodes. The isolation ring with the first type conductivity 150 may include a material selected from a group consisting silicon dioxide, silicon nitride, silicon oxynitride, polyimide and spin coated glass, or combinations thereof.

The isolation ring with the first type conductivity 150 isolates the photodiode from peripheral region, such that noises generated in the peripheral region are isolated from the photodiode. Therefore, imaging quality is improved. In a situation that the incident lights are relatively strong, electrons may escape from the BSI image sensor. If the escaped electrons are captured by the photodiode, signal crosstalk may occur, which may affect the imaging quality. In this embodiment, the isolation ring with the first type conductivity 150 may be electrically connected to a high potential, then the escaped electrons can be captured and pumped to the high potential, and then the imaging quality can be further improved.

A method for forming the isolation ring with the first type conductivity 150 may include: forming a photoresist layer (not shown) having an opening on the surface of the semiconductor substrate with the first type conductivity 100, where a position of the opening corresponds to that of the isolation ring with the first type conductivity 150 to be formed; by employing the photoresist as a mask, implanting first type conductivity ions to form the isolation ring with the first type conductivity 150 surrounding the photodiode; and performing a rapid annealing process on the isolation ring with the first type conductivity 150 to active the implanted first conductivity ions.

In other embodiments of the present disclosure, the isolation ring with the first type conductivity 150 may be replaced by a Shallow Trench Isolation (STI) structure or a Local Oxidation of Silicon (LOCOS) isolation structure.

In one embodiment, the area with the second type conductivity 110 is self-aligned with the isolation layer with the first type conductivity 120. That is, the area with the second type conductivity 110 and the isolation layer with the first type conductivity 120 can be formed by a same mask, such that the area with the second type conductivity 110 and the isolation layer with the first type conductivity 120 have self alignment features.

In one embodiment, a method for forming the photodiode and the isolation layer with the first type conductivity 120 may include: coating a photoresist layer (not shown) on the surface of the semiconductor substrate with the first type conductivity 100; by using a first mask, performing a photolithography process including exposure and development (not shown), to form a patterned photoresist layer; performing a first doping process by employing the patterned photoresist layer as a mask, to dope impurity ions in the semiconductor substrate with the first type conductivity 100, such that an area with a second type conductivity 110 is formed and then a photodiode is formed; by using the first mask again, and performing a photolithography process including exposure and development, to form the an isolation layer with the first type conductivity 120, wherein the first doping process may be an ion implantation process, and the doped impurity ions may include a material selected from phosphorus ions, arsenic ions, antimony ions, or a combination thereof.

It should be noted that, in other embodiments of the present disclosure, a mask, instead of the photoresist, may be directly used to perform the doping process, so as to form the photodiode and the isolation layer with the first type conductivity 120.

In another embodiment, a method for forming the photodiode and the isolation layer with the first type conductivity 120 may include: coating a photoresist layer (not shown) on the surface of the semiconductor substrate with the first type conductivity 100; by using a first mask, performing a photolithography process including exposure and development (not shown) on the photoresist layer, to form a groove (not shown) on the surface of the semiconductor substrate with the first type conductivity 100; performing a doping process to form a photodiode in a portion of the semiconductor substrate with the first type conductivity 100 corresponding to the bottom of the groove; etching sidewalls of the groove to enlarge the groove; and filling the groove to form an isolation layer with the first type conductivity 120.

In one embodiment, a method for forming the gate structure 130 of the pass transistor may include: forming an oxide layer (not shown) by a thermal oxidation process; depositing a polysilicon layer (not shown) on the oxide layer; forming a patterned photoresist layer on the polysilicon layer; by employing the patterned photoresist layer as a mask, performing a dry etching process or a wet etching process on the polysilicon layer and the oxide layer, so as to form a gate oxide layer 131 and a gate electrode layer 132 covering the gate oxide layer 131; performing a Physical Vapor Deposition (PVD) process, a Chemical Vapor Deposition (CVD) process or an Atomic Layer Deposition (ALD) process to form a spacer material (not shown); and performing a dry etching process on the spacer material to form a gate spacer 133.

It should be noted that, even not shown in FIG. 1, in one embodiment, an Interlayer Dielectric (ILD) layer and an interconnection structure may be formed on the front side of the semiconductor substrate with the first type conductivity 100 of the BSI image sensor. The conductive interconnection structure may include a contact element, a through hole, a conductive material, etc. In some embodiments, the conductive material may include a material selected from aluminum, aluminum silicon copper alloy, titanium, titanium nitride, tungsten, polysilicon, silicide, or a combination thereof, and the conductive interconnection structure may be formed by a PVD process, a CVD process, an ALD process, or a combination thereof. In some embodiments, the conductive material may include a material selected from copper, copper alloy, titanium, titanium nitride, tantalum, titanium nitride, tungsten, polysilicon, metal silicide, or a combination thereof, and the conductive interconnection structure can be formed by a CVD process, a sputtering process, an electroplating process, etc. The interlayer dielectric layer may include silicon oxide or silicon nitride. The interlayer dielectric layer may be formed by a CVD process, a PVD process or other proper processes, and the interlayer dielectric layer may be polished by a Chemical Mechanical Polishing (CMP) process.

It should be noted that, even not shown in FIG. 1, in the BSI image sensor according to one embodiment, a color filter layer and a micro lens layer on the color filter layer may be formed on a back surface of the semiconductor substrate with the first type conductivity 100. The color filter layer may be filters with different colors (such as, red, green and blue). The color filter layer may include a polymeric material, for example, a negative photoresist with acrylic polymer as substrate, and further include color dye. The micro-lens layer is adapted for focusing lights to the photodiode. The micro-lens layer may include resin and may be formed by a reflow process.

In the BSI image sensor, the gate structure 130 of the pass transistor covers above the photoresist. Therefore, the etching processes, performed in the process for forming the gate structure 130, may not etch the portion of the surface of the semiconductor substrate with the first type conductivity 100 above the photodiode. Thus, defects on the surface of the semiconductor substrate with the first type conductivity 100 above photodiode can be reduced, a dark current caused by the defects on the surface of the semiconductor substrate with the first type conductivity 100 above photodiode can be prevented, and then the performance of the image sensor can be improved.

Figure 2:
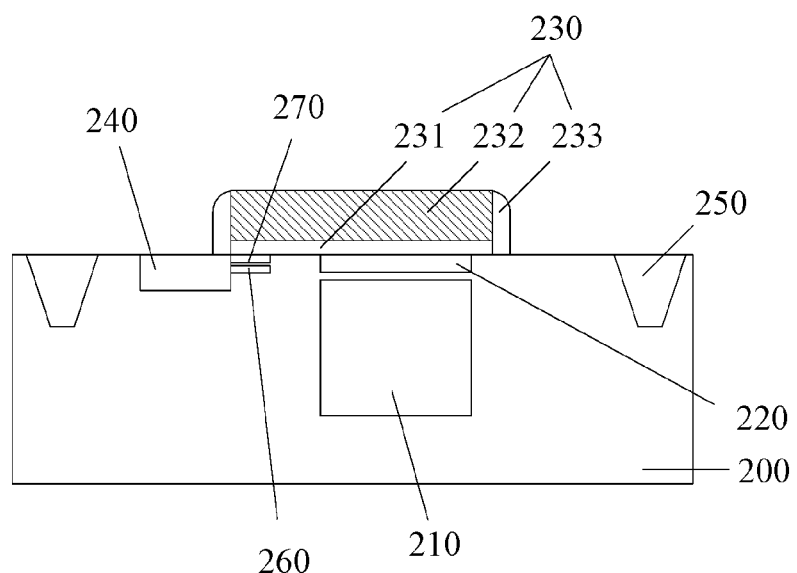
FIG. 2 schematically illustrates a structural diagram of a BSI image sensor according to another embodiment of the present disclosure.

As shown in FIG. 2, a BSI image sensor is provided according to another embodiment of the present disclosure. The BSI image sensor includes a semiconductor substrate with a first type conductivity 200, a photodiode, an isolation layer with the first type conductivity 220, a floating diffusion area 240 and a gate structure 230 of a pass transistor. The gate structure 230 of the pass transistor includes a gate oxide layer 231, a gate electrode layer 232 and a gate spacer 233.

Position relationships, connection relationships and properties of elements of this embodiment may refer to above embodiments, and will not be described in detail herein.

A difference between this embodiment and above embodiments is that, the BSI image sensor of this embodiment further includes a light doped area with the second type conductivity 270 and a light doped area with the first type conductivity 260. Wherein, the light doped area with the second type conductivity 270 is formed in the semiconductor substrate with the first type conductivity 200, and is in contact with the floating diffusion area 240. The light doped area with the first type conductivity 260 is formed below the light doped area with the second type conductivity 270, and is also in contact with the floating diffusion area 240. Meanwhile, at least a portion of the light doped area with the second type conductivity 270 and a portion of the light doped area with the first type conductivity 260 are disposed below the gate structure 230 of the pass transistor.

As the floating diffusion area 240 is a heavily doped area, the photo-generated carriers may have a limited transmission rate and may easily diffuse to outside area.

In this embodiment, as the light doped area with the second type conductivity 270 is formed and is in contact with the floating diffusion area 240, the light doped area with the second type conductivity 270 can be regarded as an extension part of the floating diffusion area 240. The light doped area with the second type conductivity 270 reduces a distance between the floating diffusion area 240 and the photodiode. Therefore, when the gate structure 230 of the pass transistor is turned on to work, the photo-generated carriers can be quickly transferred to the floating diffusion area 240, a transmission efficiency of the photo-generated carriers is improved, and signal delay is reduced.

In order to prevent a direct conduction of the light doped area with the second type conductivity 270 and the area with the second type conductivity 220, the light doped area with the first type conductivity 260 is formed below the light doped area with the second type conductivity 270 in this embodiment, so as to isolate the light doped area with the second type conductivity 270 from the area with the second type conductivity 220.

In one embodiment, the light doped area with the second type conductivity 270 is self-aligned with the light doped area with the first type conductivity 260. That is, the light doped area with the second type conductivity 270 and the light doped area with the first type conductivity 260 can be formed by a same mask, such that the light doped area with the second type conductivity 270 and the light doped area with the first type conductivity 260 have self alignment features.

In one embodiment, a method for forming the light doped area with the second type conductivity 270 and the light doped area with the first type conductivity 260 may include: coating a photoresist layer on the surface of the semiconductor substrate with the first type conductivity 200; by using a second mask, performing a photolithography process including exposure and development; forming the light doped area with the first type conductivity 260 by a doping process; and forming the light doped area with the second type conductivity 270 above the light doped area with the first type conductivity 260 by a similar process as the above process.

It should be noted that, in other embodiments of the present disclosure, a mask instead of the photoresist, may be directly used to perform the doping process, so as to form the light doped area with the second type conductivity 270 and the light doped area with the first type conductivity 260.

In another embodiment, a method for forming the light doped area with the second type conductivity 270 and the light doped area with the first type conductivity 260 may include: coating a photoresist layer on the surface of the semiconductor substrate with the first type conductivity 200; by using a second mask, performing a photolithography process including exposure and development, so as to form a groove (not shown) on the surface of the semiconductor substrate with the first type conductivity 200; forming the light doped area with the first type conductivity 260 in a portion of the semiconductor substrate with the first type conductivity 200 corresponding to the bottom of the groove by performing a doping process; etching sidewalls of the groove to enlarge the groove; and filling the groove to form the light doped area with the second type conductivity 270.

In one embodiment, as the light doped area with the second type conductivity 270 is formed in contact with the floating diffusion area 240, a distance between the floating diffusion area 240 and the photodiode reduced, and then when the gate structure 230 of the pass transistor is turned on to work, the photo-generated carriers can be quickly transferred to the floating diffusion area 240, and a transmission efficiency of the photo-generated carriers is improved.

In one embodiment of the present disclosure, a method for reduce dark current of a BSI image sensor is also provided. The method can be applied to the BSI image sensor described above.

In the method, when the semiconductor substrate with the first type conductivity is a P-type semiconductor substrate, a voltage ranging from −3.0V to −0.5V is applied to the gate structure. Specifically, the voltage applied to the gate structure may be −3.0V, −2.5V, −2.0V, −1.5V, −1.0V or −0.5V. At the moment, the voltage may make holes accumulate at a portion of the P-type semiconductor substrate corresponding to the gate structure, such that the defects at the interface between the P-type semiconductor substrate and the gate oxide layer may be isolated from the N-type area of the photodiode. The defects at the interface between the P-type semiconductor substrate and the gate oxide layer play an important role in generating a dark current. In this embodiment, by applying a proper negative voltage on the gate structure, the defects at the interface between the P-type semiconductor substrate and the gate oxide layer can be isolated from the N-type area of the photodiode, so as to reduce the dark current.

In the method, when the semiconductor substrate with the first type conductivity is a N-type semiconductor substrate, a voltage ranging from +0.5V to +3.0V is applied to the gate structure. Specifically, the voltage applied to the gate structure may be +0.5V, +1.0V, +1.5V, +2.0V, +2.5V or +3.0V. At the moment, the voltage may make holes accumulate at a portion of the N-type semiconductor substrate corresponding to the gate structure, such that the defects at the interface between the N-type semiconductor substrate and the gate oxide layer may be isolated from the P-type area of the photodiode. The defects at the interface between the N-type semiconductor substrate and the gate oxide layer play an important role in generating a dark current. In this embodiment, by applying a proper positive voltage on the gate structure, the defects at the interface between the N-type semiconductor substrate and the gate oxide layer can be isolated from the P-type area of the photodiode, so as to reduce the dark current.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:

1. A method for reducing dark current of a Back Side Illumination (BSI) image sensor, wherein the BSI image sensor comprises:
   a photodiode formed by forming an area with a second type conductivity in a semiconductor substrate with a first type conductivity, wherein the area with the second type conductivity is defined as an area for collecting photo-generated carriers;
   an isolation layer with the first type conductivity formed in the semiconductor substrate with the first type conductivity and above the photodiode;
   a gate structure of a pass transistor formed on a top surface of the semiconductor substrate with the first type conductivity and being corresponding to the isolation layer with the first type conductivity, wherein the gate structure comprises a gate oxide layer, a gate electrode layer and a gate spacer, and the gate structure covers the photodiode correspondingly; and a floating diffusion area formed in the semiconductor substrate with the first type conductivity and being heavily doped with the second type conductivity;

and wherein the method comprises:

when the semiconductor substrate with the first type conductivity is a P-type semiconductor substrate, applying a voltage ranging from −3.0V to −0.5V to the gate structure, wherein the voltage makes holes accumulate at a portion of the P-type semiconductor substrate corresponding to the gate structure, such that the defects at the interface between the P-type semiconductor substrate and the gate oxide layer are isolated from the N-type area of the photodiode to reduce the dark current; and when the semiconductor substrate with the first type conductivity is a N-type semiconductor substrate, applying a voltage ranging from +0.5V to +3.0V to the gate structure, wherein the voltage makes electrons accumulate at a portion of the N-type semiconductor substrate corresponding to the gate structure, such that the defects at the interface between the N-type semiconductor substrate and the gate oxide layer are isolated from the P-type area of the photodiode to reduce the dark current.

2. The method according to claim 1, wherein the BSI image sensor further comprises: an isolation ring with the first type conductivity, wherein the isolation ring with the first type conductivity is formed in the semiconductor substrate with the first type conductivity, surrounds the photodiode, and is adapted for preventing carrier crosstalk between adjacent photodiodes.

3. The method according to claim 1, wherein the area with the second type conductivity and the isolation layer with the first type conductivity have self alignment features.

4. The method according to claim 3, wherein a photoresist layer is coated on the surface of the semiconductor substrate with the first type conductivity; by using a first mask, a photolithography process comprising exposure and development is performed; and a doping process is performed to form the photodiode and the isolation layer with the first type conductivity.

5. The method according to claim 3, wherein a photoresist layer is coated on the surface of the semiconductor substrate with the first type conductivity; by using a first mask, a photolithography process comprising exposure and development is performed, so as to form a groove on the surface of the semiconductor substrate with the first type conductivity; a doping process is performed to form the photodiode in a portion of the semiconductor substrate with the first type conductivity corresponding to a bottom of the groove; sidewalls of the groove is etched to enlarge the groove; and the groove is filled to form an isolation layer with the first type conductivity in a portion of the semiconductor substrate with the first type conductivity corresponding to the groove.

6. The method according to claim 1, wherein the BSI image sensor further comprises: a light doped area with the second type conductivity formed in the semiconductor substrate with the first type conductivity; and a light doped area with the first type conductivity formed below the light doped area with the second type conductivity, wherein the light doped area with the second type conductivity and the light doped area with the first type conductivity have self alignment features; and wherein at least a portion of the light doped area with the second type conductivity and a portion of the light doped area with the first type conductivity are disposed below the gate structure of the pass transistor, and are in contact with the floating diffusion area.

7. The method according to claim 6, wherein a photoresist layer is coated on the surface of the semiconductor substrate with the first type conductivity; by using a second mask, a photolithography process comprising exposure and development is performed; and a doping process is performed to form the light doped area with the second type conductivity and the light doped area with the first type conductivity.

8. The method according to claim 6, wherein a photoresist layer is coated on the surface of the semiconductor substrate with the first type conductivity; by using a second mask, a photolithography process comprising exposure and development is performed, so as to form a groove on the surface of the semiconductor substrate with the first type conductivity; a doping process is performed to form the light doped area with the second type conductivity in a portion of the semiconductor substrate with the first type conductivity corresponding to a bottom of the groove; sidewalls of the groove is etched to enlarge the groove; and the groove is filled to form the light doped area with the first type conductivity.

9. The method according to claim 1, wherein when the first type conductivity is P-type, the second type conductivity is N-type; or when the first type conductivity is N-type, the second type conductivity is P-type.

* * * * *